Oct. 22, 1963 R. S. SOLOROW ET AL 3,107,965

COMPONENT MOUNTING

Filed Dec. 22, 1960 2 Sheets-Sheet 1

INVENTORS
RUSSELL S. SOLOROW
BARRY BADNER
BY
ATTORNEY

COMPONENT MOUNTING

Filed Dec. 22, 1960

2 Sheets-Sheet 2

INVENTORS
RUSSELL S. SOLOROW
BARRY BADNER
BY
ATTORNEY

United States Patent Office 3,107,965

Patented Oct. 22, 1963

3,107,965
COMPONENT MOUNTING

Russell S. Solorow, Norwalk, Conn., and Barry Badner, Brooklyn, N.Y., assignors to Burndy Corporation, a corporation of New York Filed Dec. 22, 1960, Ser. No. 77,749
4 Claims. (Cl. 339—217)

This invention relates to electrical connectors, and more particularly to a means to electrically and mechanically connect a component to a supporting panel.

While widely applicable, the invention is particularly useful in the connection of components, such as a socket type contact, to a printed circuit board. These printed circuit boards conventionally comprise a nonconductive supporting panel on which are mounted conductive strips. The strips may be secured to one or both sides of the panel to provide a predetermined electrical circuit arrangement. Holes may be provided through the conductive strips and supporting panel to facilitate the electrical connection of electrical components thereto. A component element, such as a wire or a tab may be thrust through the hole and then soldered to the conductive strip. The wires or tabs must be retained in the holes prior to and during the soldering operation. If the panel is to be disturbed prior to soldering, an intermediate step of bending or twisting the free ends of the wires or tabs must be performed. A satisfactory electrical and mechanical connection is provided only by the soldering operation.

An object of this invention, therefore, is to provide a means for connecting components to printed circuit boards which requires only a simple insertion step to directly provide a secure electrical and mechanical connection.

Another object is to provide a connection means which may be conveniently soldered after insertion.

A feature of this invention is a pair of resiliently biased-apart, cantilevered legs, each having a reversely bent end, to mount a component to a panel by means of a hole therein.

These and other objects and features of this invention will become more apparent by reference to the following description taken in conjunction with the accompanying drawings, in which.

Figure 1:
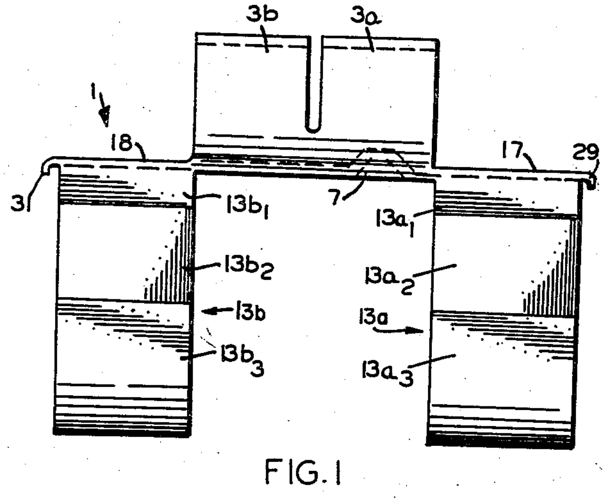
FIG. 1 is a side view of a socket contact embodying this invention.
Figure 2:
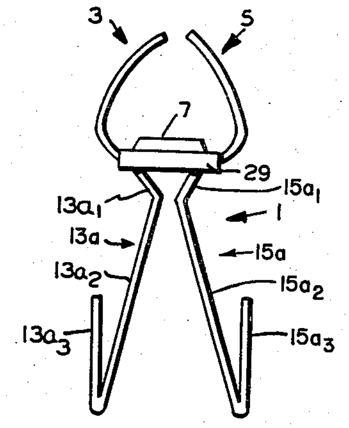
FIG. 2 is a front view of the contact of FIG. 1.
Figure 4:
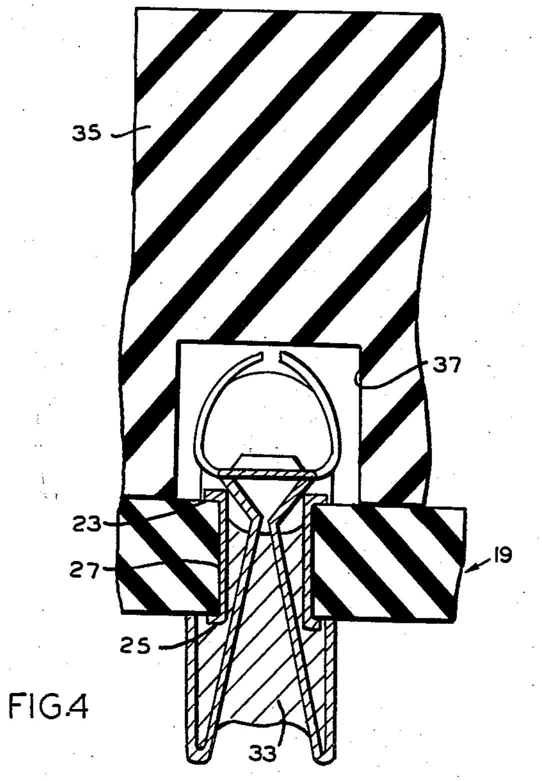
FIG. 4 is a front view in section taken along line IV—IV of FIG. 3 without a pin contact installed.
Figure 3:
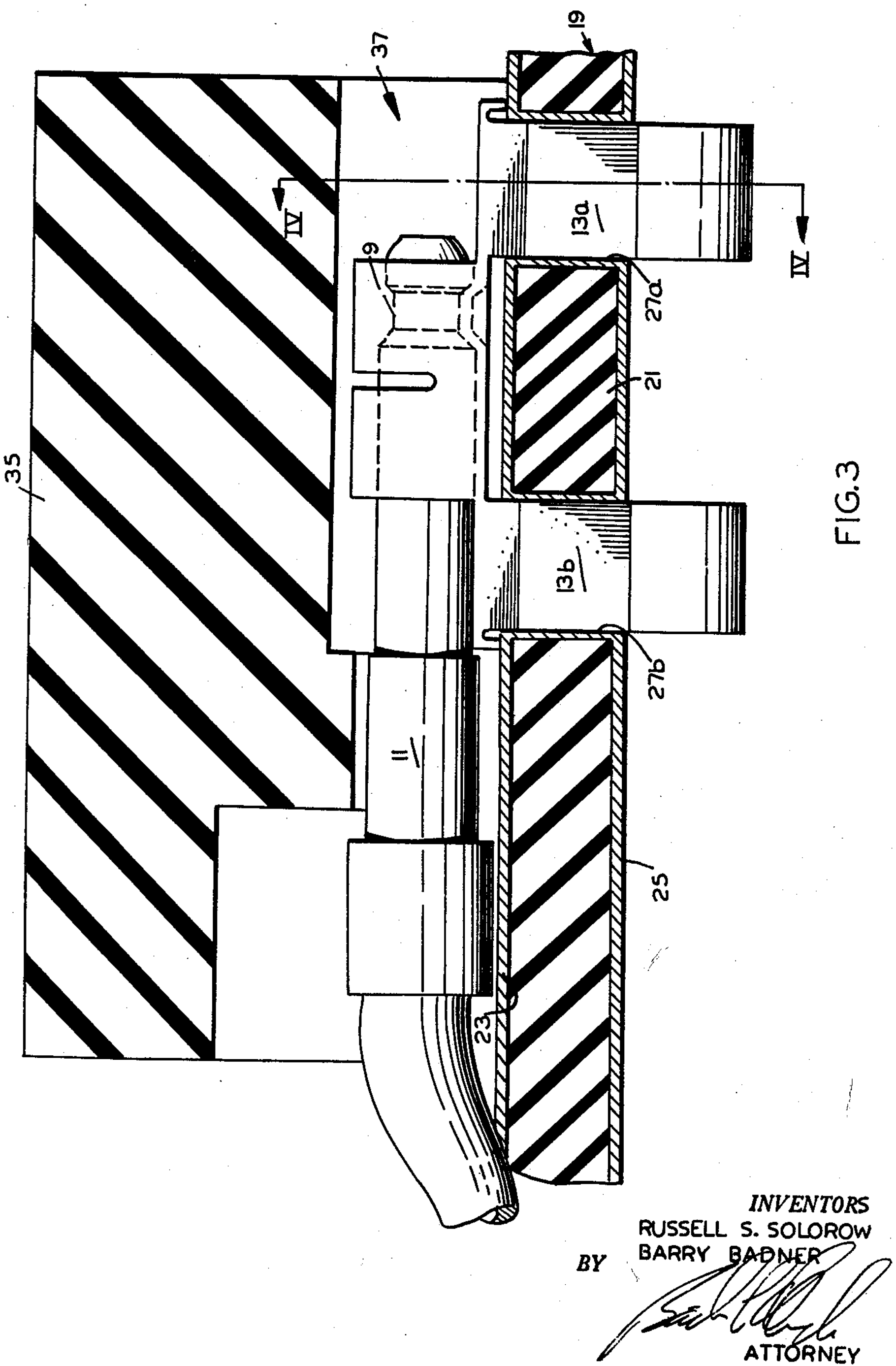
FIG. 3 is a side view in partial section of the contact of FIG. 1 installed in a printed circuit board.

Referring to the drawings, it will be seen that the socket contact 1 may be formed of sheet metal with a pair of opposed arms 3 and 5 forming a pin contact receiving socket. Each arm of the pair may be divided into a plurality of sub portions such as *3a* and *3b* to form a plurality of axially spaced, axially aligned pairs of sub portions providing a plurality of independently resilient pin contacting elements. A pair of opposed, resilient locking legs 13a and 15a is supported in cantilever fashion from an axial extension 17 at one end of the socket, and a second substantially identical pair of legs (of which leg 13b only is visible in the drawings) is supported in like fashion from an extension 18 at the other end of the socket. Each leg, e.g., 13a, is bent into three sub portions, illustrated by inwardly bent portion $13a_1$ outwardly bent portion $13a_2$, and upwardly bent portion $13a_3$ which extends back along portion $13a_2$ in the opposite direction; the legs are thus shaped to interlock with the printed circuit board.

The board 19 is formed of a dielectric base member 21 which includes a pair of connector mounting holes 27a, 27b, and may include an upper conductive surface strip 23 and a lower conductive surface strip 25 wherein conductive surface material may line the inner wall of each hole 27a, 27b, interconnecting strips 23 and 25.

Assembly of the contact to the board is accomplished by compressing the two legs of each pair together, inserting one pair through each of holes 27a, 27b respectively, and then permitting the legs of each pair to expand outwardly so that the distance between the free ends of the oppositely extending (upwardly bent) subportions, e.g., $13a_3$, $15a_3$, of each pair are spaced wider than the width of the holes.

The free ends of extensions 17 and 18 of the base of the socket are bent over to form stand-off portions 29 and 31 which resiliently engage the board and support the socket above its surface to permit insertion of a pin contact having a rear diameter greater than the socket diameter. Thus, the socket is mechanically locked to the board by means of the combined opposed action of the standoffs 29 and 31 on one side, and the free ends of the leg subportions corresponding to $13a_3$ and $15a_3$, for example, on the other. A dimple 7 may be provided in the base of the socket between extensions 17 and 18 to engage a peripheral groove 9 in an inserted mating pin contact 11 to maintain contact pressure and improve contact retention.

As may be seen in the drawings, the contact is in mechanical and electrical contact with upper conductive surface strip 23 through the tips of standoffs 29 and 31. If so desired, electrical contact directly to lower strip 25 might be established through the free ends of the reversely bent leg sub portions, e.g., $13a_3$, $15a_3$. In addition, the contact 1 may be permanently secured to the board 19 by conventional dip soldering techniques; solder 33 rising by capillary action into the holes 27a, 27b to solder the locking arms to the plated-through hole.

A dielectric housing 35, having channels 37, may be secured to the board 19 by suitable means such as jack screws (not shown) to protect the contacts 1. A plurality of contacts 1 may be secured to the board 19 in closely spaced parallel relationship. The housing will protect and isolate the contacts from accidental contact. Contact pins 11 may be inserted through the channels 37 into the sockets 1 from one direction, while test probes (not shown) may be inserted through the channels 37 to the sockets 1 from the other direction.

The invention has thus been described, but it is desired to be understood that it is not confined to the particular forms or usages shown and described, the same being merely illustrative, and that the invention may be carried out in other ways without departing from the spirit of the invention and, therefore, the right is broadly claimed to employ all equivalent instrumentalities coming within the scope of the appendent claims, and by means of which objects of this invention are obtained and new results accomplished, as it is obvious that the particular embodiments herein shown and described are only some of the many that can be employed to obtain these objects and accomplish these results.

We claim:

1. A connector for mating with a pin contact, adapted to be mounted on a printed circuit board having at least a pair of holes therethrough, comprising: a socket portion including at least two pair of resilient opposed arms disposed in axially spaced apart, axially aligned relationship for axially receiving a pin contact; at least two pairs of resilient opposed legs depending from said socket portion substantially perpendicularly to a plane through the axis thereof including one pair of legs at one end of said socket portion and another pair at the other end thereof; a pair of standoff elements depending from opposite ends of said connector; each of said pairs of legs including a pair of diverging upwardly bent leg portions extending toward said socket portion; said leg portions each terminating in a free end disposed in a common plane substantially parallel to, and spaced from a plane through the edges of said standoff elements by a distance approximately equal to the thickness of said printed circuit board; whereby the legs of each of said pairs of legs may be brought together and inserted through one of said holes in said printed circuit board and then released, said free ends returning to a spaced apart distance greater than the diameter of said hole.

2. A connector according to claim 1 wherein said socket portion, said pair of legs and said standoff elements are all integral.

3. A connector according to claim 1 wherein the legs of each pair are disposed in part in converging and in part in substantially diverging relationship.

4. A socket for mating with a pin contact comprising a base portion, at least a pair of opposed arms upstanding from said base to form a generally circular cross section socket portion adapted to resiliently engage an inserted mating pin contact;

at least two pairs of legs depending from said base portion spaced longitudinally from said socket portion;

each leg of each of said pairs including a reversely bent portion positioned remote from the other leg in the pair;

the two legs of each pair being resiliently biased in a spread apart state; and a pair of standoff elements formed from said base portion having the free ends thereof depending in the direction of said legs.

References Cited in the file of this patent

UNITED STATES PATENTS

| | | |
|---|---|---|
| 1,641,530 | Chamberlain | Sept. 6, 1927 |
| 1,987,035 | Tideman | Jan. 8, 1935 |
| 2,257,317 | Wade | Sept. 30, 1941 |
| 2,747,169 | Johanson | May 22, 1956 |
| 2,958,065 | Flanagan | Oct. 25, 1960 |

FOREIGN PATENTS

| | | |
|---|---|---|
| 1,087,366 | France | Aug. 25, 1954 |
| 372,140 | Great Britain | May 5, 1932 |